(12) United States Patent
Glass

(10) Patent No.: US 7,672,820 B2
(45) Date of Patent: *Mar. 2, 2010

(54) ANALYZING LINEARIZATION OF MODELS IN MODELING ENVIRONMENTS

(75) Inventor: John Glass, Franklin, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/841,949

(22) Filed: Aug. 20, 2007

(65) Prior Publication Data

US 2009/0012756 A1 Jan. 8, 2009

Related U.S. Application Data

(63) Continuation of application No. 10/940,104, filed on Sep. 13, 2004.

(51) Int. Cl.
    *G06G 7/48* (2006.01)
(52) U.S. Cl. .................... 703/6; 703/1; 703/13
(58) Field of Classification Search ............. 703/2, 703/6, 17
    See application file for complete search history.

(56) References Cited

U.S. PATENT DOCUMENTS 4,327,383 A   4/1982   Holt 7,178,112 B1   2/2007   Ciolfi et al.

FOREIGN PATENT DOCUMENTS

EP   1008482 A2   6/2000

OTHER PUBLICATIONS

Mathoworks, Inc., "Using Simulink Version 5," The Mathworks, Inc., pp. i through I-18, 2002.*
Mathworks, Inc., "Control System Toolbox User's Guide version 4.2", The Mathworks Inc., pp. i through I-13, 1999.*
The MathWorks, Inc.; "Control System Toolbox User's Guide"; 1998; Version 4.1; pp. 1-535.*
Dunn, Peter K., "glmlab Using MATLAB for analysing generalised linear models," University of Southern Queensland, pp. i-41 (2000).
Mathworks, Inc., "Control System Toolbox User's Guide version 4.2," The Mathworks, Inc., pp. 2-1 through 2-60; 3-1 through 3-28 (1999).
Mathworks, Inc., "Using Simulink Version 5," The Mathworks, Inc., pp. 11-1 through 11-8 (2002).
MathWorks, "Using Simulink® Version 6," (2004).
Roth, Zvi S., "Computer-Aided Control Systems Course Instruction," *World Automation Congress*, 2002, Proceedings of the 5th Biannual Jun. 9-13, 2002, Piscataway, NJ, USA, IEEE, vol. 14:405-410.

(Continued)

*Primary Examiner*—Jason Proctor
(74) *Attorney, Agent, or Firm*—Lahive & Cockfield LLP; Kevin J. Canning

(57) ABSTRACT

A device provides an interface for permitting a user to define a block diagram model that represents a system, linearizing at least a portion of the block diagram model, analyzing a linearization result of at least one block of the block diagram model to determine contribution information of the at least one block toward a linearization result of the block diagram model, and outputting information concerning a result of analyzing the linearization result.

25 Claims, 9 Drawing Sheets

OTHER PUBLICATIONS

Salama, Samir, "Simulation of Power Electronics Systems using 'SimuPec': The new Power electronics toolbox for 'Simulink/Matlab,'" *2004 35th Annual IEEE Power Electronics Specialists Conference*, vol. 5:3409-3413 (2004).

Schoder, Karl et al., "PAT: A Power Analysis Toolbox for MATLAB/Simulink," *IEEE Transactions on Power Systems*, vol. 18(1):42-47 (2003).

Taylor, James H. et al, "Linearization Algorithm for Computer-Aided Control Engineering," *IEEE Control Systems Magazine USA*, vol. 13(2):58-64 (1993).

International Search Report for Application No. PCT/US2005/033156, dated Dec. 7, 2006.

Invitation to Pay Additional Fees for Application No. PCT/US2005/033156, dated Jun. 22, 2006.

MathWorks, Inc., "Control System Toolbox, For Use with MATLAB, User's Guide version 4.1," The MathWorks, Inc. (1998).

\* cited by examiner

ANALYZING LINEARIZATION OF MODELS IN MODELING ENVIRONMENTS

RELATED APPLICATION

This application is a continuation of U.S. patent application Ser. No. 10/940,104, filed on Sep. 13, 2004, the entire content of which is incorporated by reference herein.

FIELD OF THE INVENTION

The present invention relates to modeling environments, and more particularly to methods and systems for analyzing the linearization of models in the modeling environments.

BACKGROUND OF THE INVENTION

Various classes of block diagrams describe computations that can be performed on application specific computational hardware, such as a computer, microcontroller, FPGA, and custom hardware. Classes of such block diagrams include time-based block diagrams such as those found within Simulink® from the MathWorks, Inc. Natick Mass., state-based and flow diagrams such as those found within Stateflow® from the MathWorks, Inc. Natick Mass., and data-flow diagrams. A common characteristic among these various forms of block diagrams is that they define semantics on how to execute the diagram.

The process of linearization is the approximation of complex models (i.e., non-linear models) that yields a sufficiently simple linear model for engineering analysis tools. Linearization is a well-known commonly used analysis tool that has been documented in many control textbooks. A fundamental principle of linearization analysis is that the approximation of a complex model is accurate for regions near a baseline, equilibrium, or operating condition.

Conventional block diagram modeling environments provide tools for linearizing block diagram models. For example, Simulink® Control Design provides extensive tools for linearizing Simulink® model. The difficulty in linearizing a model in a block diagram modeling environment is that each element in a model contributes to the overall linearization. Typically many industrial models can be described by greater then 1000 blocks making the process of understanding how each block contributes to a linearization is difficult. Although the conventional block modeling environments provide tools for linearizing block diagram models, the conventional block diagram modeling environments do not allow users to properly analyze the linearization results of the block diagram models. Therefore it is desired to provide tools for the users to properly analyze the linearization results of models so that the users are able to explore in detail how each of linearization factors contributes to the linearization of the models.

SUMMARY OF THE INVENTION

The present invention provides methods and systems for analyzing and diagnosing difficulties in the linearization of a model in a modeling environment. The modeling environment may provide tools for linearizing the model to generate a linear model. The modeling environment may also provide tools for analyzing the linearization of the model. The tools for analyzing the linearization of the model may analyze the linear model to determine whether the model is properly linearized. For example, the linear model may be analyzed to determine whether some components of a model are linearized at a region near discontinuity or singularity. The linear model may also be analyzed to determine whether some components of a model are linearized to have an extremely low or high slope. Information on the linearization of the model may be provided to users so that the users are able to modify the information on the linearization of the model and have the model linearized again using the modified information. Additionally, the tools may report or provide search tools for additional diagnostic information to the user.

According to one aspect, a computer-readable medium may contain instructions executable by at least one processor. The computer-readable medium may include one or more instructions for providing an interface for permitting a user to define a block diagram model representing a system; one or more instructions for permitting a user to select an input linearization point, an output linearization point, and an operating point; one or more instructions for linearizing the block diagram model based on the input linearization point, the output linearization point, and the operating point to form a linearized model; one or more instructions for analyzing a linearization result of at least one block of the block diagram model to determine contribution information of the at least one block toward a linearization result of the block diagram model; and one or more instructions for outputting information concerning a result of analyzing the linearization result.

According to another aspect, a computer-implemented method may include providing an interface for permitting a user to define a block diagram model that represents a system; linearizing at least a portion of the block diagram model; analyzing a linearization result of at least one block of the block diagram model to determine contribution information of the at least one block toward a linearization result of the block diagram model; and outputting information concerning a result of analyzing the linearization result.

According to yet another aspect, a device may include a memory to store instructions and a processor to execute the instructions. The processor may permit a user to define a block diagram model that represents a system and execute at least a portion of the block diagram model. The processor may analyze execution results of at least one block of the block diagram model to determine contribution information toward a linearization result of the block diagram model, where the contribution information includes at least one of an input signal, an output signal, a state signal, or a linearization parameter associated with the at least one block. The processor may output information regarding a result of the analyzing.

According to a further aspect, a system may include means for defining a block diagram model that represents a system; means for receiving an input from a user; means for linearizing at least a portion of the block diagram model based on the input; and means for analyzing a parameter effecting a linearization result of at least one block of the block diagram model to determine contribution information of the parameter of the at least one block toward a linearization result of the block diagram model.

BRIEF DESCRIPTION OF THE DRAWINGS

The present invention will become better understood with reference to the following description and accompanying drawings, wherein.

DETAILED DESCRIPTION

An illustrative embodiment of the present invention relates to the linearization of a model in a modeling environment. The linearization of a model is the approximation of a nonlinear system as a linear system in the model, based on the assumption that the system is almost linear within a certain range of operation. With the linearization of the model, users are able to analyze the dynamic behaviors of the model, for example, determine the stability of a nonlinear model around an operating point. Most frequently engineers use linear models to design control systems using well known control design methodologies. Linear models are typically expressed as a transfer function, a state space representation, or a zero-pole-gain representation, and determine the response of the model to arbitrary input signals.

In particular, the illustrative embodiment of the present invention provides users with information on the linearization results of the model so that the users are able to explore how each of linearization factors contributes to the linearization of the model. These contributing factors include:

1. The type of blocks in the model and their configurations;
2. The behavior of each of the blocks in the model when they are linearized;
3. How the blocks are interconnected; and
4. The values of each of the individual block inputs, outputs, and states determine the linear representation of each block.

Based on the linearization results gathered by this tool, the users are able to change the information on the linearization results of the model. For example, if the users do not like the linearization results of a selected element in the model, the users can specify values for the linearization of the selected element and have the model linearized again using the specified values.

The illustrative embodiment will be described solely for illustrative purposes relative to a block diagram modeling environment. As described in the Background of the Invention, the block diagram modeling environment may include a time-based block diagram modeling environment, a state-based and flow diagram modeling environment and data flow modeling environment. Although the illustrative embodiment will be described relative to the block diagram modeling environment, one of skill in the art will appreciate that the present invention may apply to other modeling environments including textual modeling environments, such as command line modeling environments.

Figure 1:
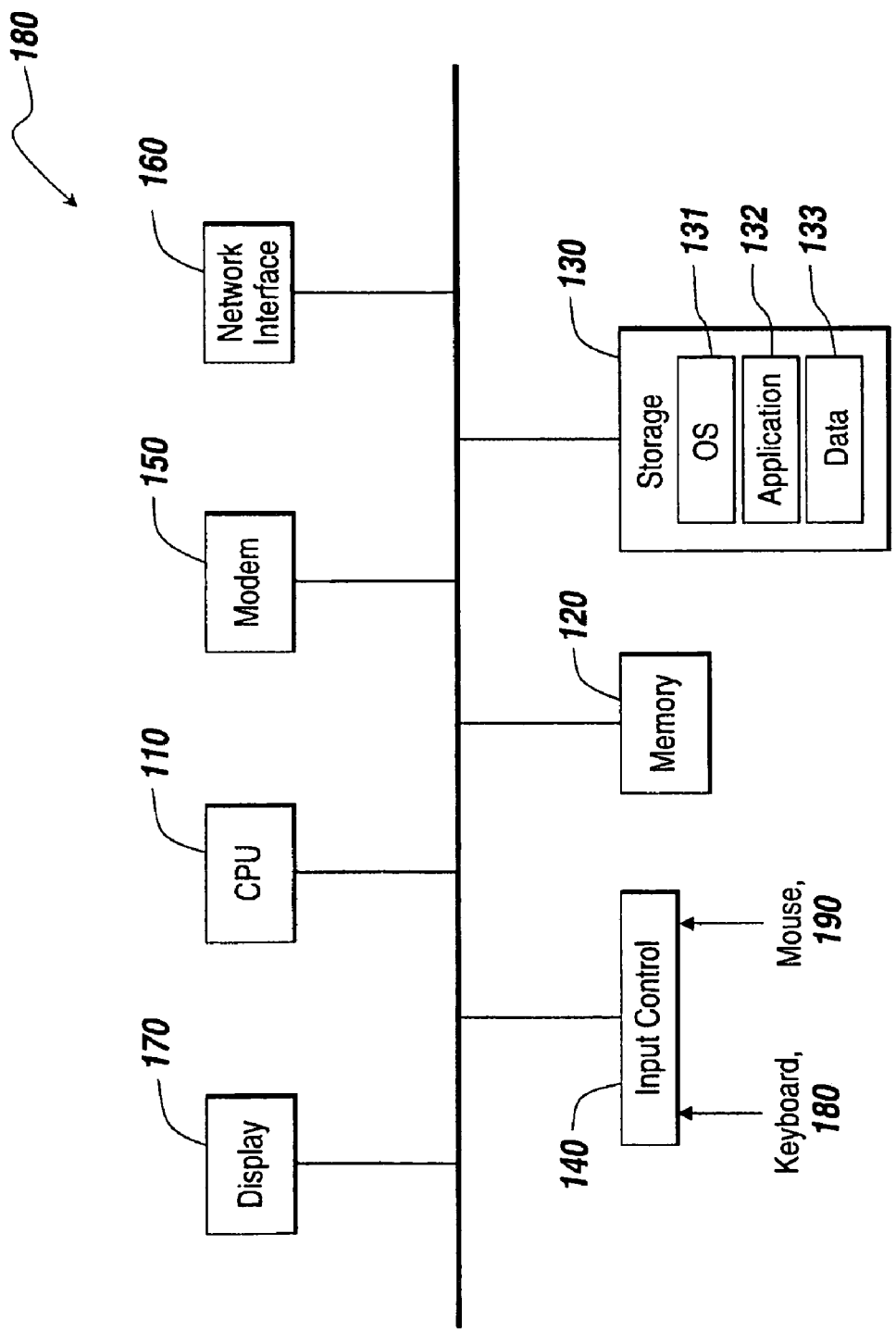
FIG. 1 shows an exemplary electronic device suitable for practicing the illustrative embodiment of the present invention.

FIG. 1 is an exemplary electronic device 100 suitable for practicing the illustrative embodiment of the present invention, which provides a block diagram modeling environment. One of ordinary skill in the art will appreciate that the electronic device 100 is intended to be illustrative and not limiting of the present invention. The electronic device 100 may take many forms, including but not limited to a workstation, server, network computer, Internet appliance, mobile device, a pager, a tablet computer, and the like.

The electronic device 100 may include a Central Processing Unit (CPU) 110, a memory device 120, a storage medium 130, an input control 140, a network interface 160, a MODEM 150, a display 170, etc. The input control 140 may interface with a keyboard 180, a mouse 190, and other input devices. The electronic device 100 may receive through the input control 140 input data necessary for creating models in the block diagram modeling environment, such as the selection of the attributes and operations of component blocks in the models. The electronic device 100 may display in the display 170 the models generated in the block diagram modeling environment. The network interface 160 and the MODEM 150 enable the electronic device 100 to communicate with other electronic devices through communication networks, such as Internet, intranet, LAN (Local Area Network), WAN (Wide Area Network) and MAN (Metropolitan Area Network). The communication facilities may support for the distributed implementations of the present invention.

The CPU 110 controls each component of the electronic device 100 to provide the block diagram modeling environment. The memory 120 fetches from the storage 130 and provides to the CPU 110 code that needs to be accessed by the CPU 110 to operate the electronic device 100 and to run the block diagram modeling environment. The storage 130 usually contains software tools for applications. The storage 130 includes, in particular, code 131 for the operating system (OS) of the device 100, code 132 for applications running on the operation system, such as applications for providing the block diagram modeling environment, and data 133 used or generated in the device 100, such as the data for block diagram models generated in the block diagram modeling environment.

An exemplary block diagram modeling environment may be found in Simulink® from The MathWorks, Inc. Simulink® provides tools for modeling and simulating a variety of dynamic systems in one integrated, graphical environment. Simulink® enables users to design a block diagram for a target system, simulate the system's behavior, analyze the performance of the system, and refine the design of the system. Simulink® allows users to design target systems through a user interface that allows drafting of block diagram models of the target systems. All of the blocks in a block library provided by Simulink and other programs are available to users when the users are building the block diagram of the target systems. Individual users may be able to customize this model block to: (a) reorganize blocks in some custom format, (b) delete blocks they do not use, and (c) add custom blocks they have designed. The blocks may be dragged through some human-machine interface (such as a mouse or keyboard) from the block library on to the window (i.e., model canvas). Simulink® includes a block diagram editor that allows users to perform such actions as draw, edit, annotate, save, and print out block diagram representations of target systems. The block diagram editor is a graphical user interface (GUI) component that allows drafting of block diagram models by users. In Simulink®, there is also a textual interface with a set of commands that allow interaction with the graphical editor, such as the textual interface provided in MATLAB®. Using this textual interface, users may write special scripts that perform automatic editing operations on the block diagram. Simulink® also allows users to simulate the designed target systems to determine the behavior of the systems. Simulink® includes a block diagram execution engine that carries out the task of compiling and linking the block diagram to produce an "in-memory executable" version of the model that is used for generating code and/or simulating a block diagram model.

Figure 2:
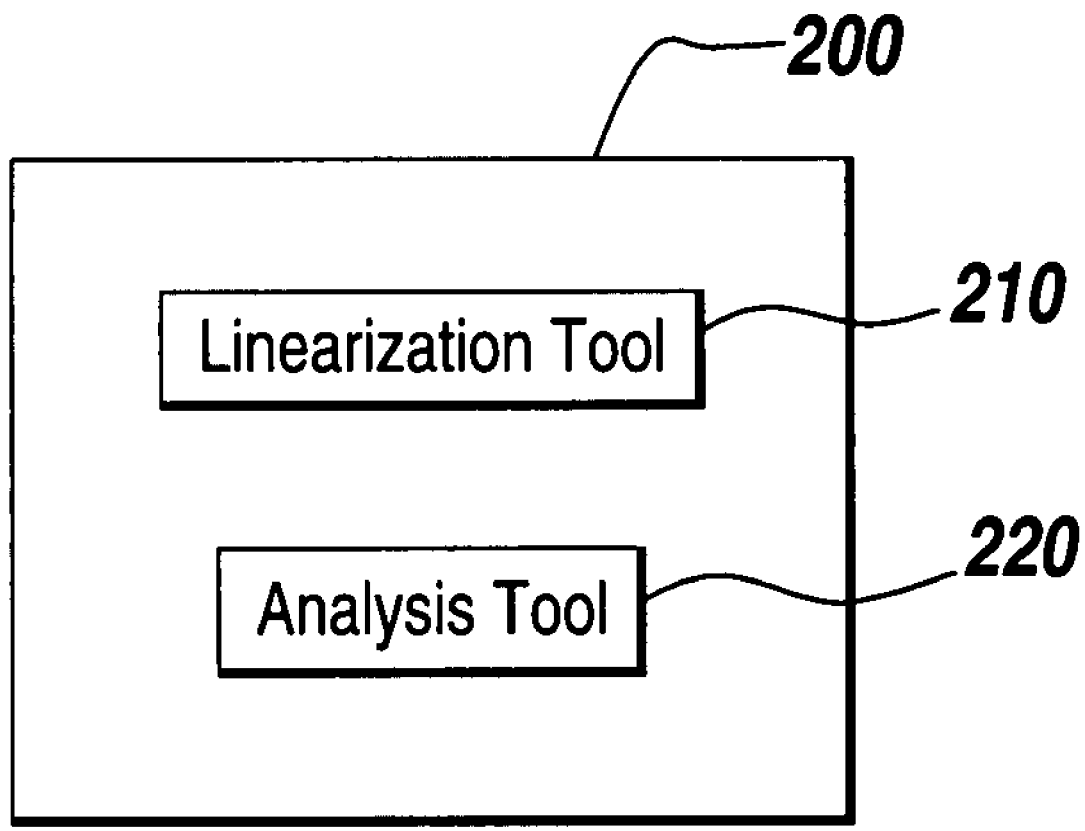
FIG. 2 depicts an exemplary block diagram modeling environment provided in the electronic device depicted in FIG. 1.

FIG. 2 shows an exemplary block diagram modeling environment 200, such as Simulink®. The block diagram modeling environment 200 may include a linearization tool 210 for linearizing models, and an analysis tool 220 for analyzing the linearization of the models. Although the linearization tool 210 and the analysis tool 220 are depicted as being incorporated into the block diagram modeling environment 200 in the illustrative embodiment, one of skill in the art will appreciate that at least one of the linearization tool 210 and the analysis tool 220 may be provided separately from the block diagram modeling environment 200.

The analysis tool 220 provides users with information on the linearization results of the model so that the users are able to explore how each of the linearization factors contributes to the linearization results. The analysis tool 220 may determine whether the model is linearized in a proper manner. If it is determined that the model is linearized in an improper manner, the analysis tool 220 provides the users with information about the impropriety. The tool 220 may enable the users to change the information provided on the linearization results of the model, and have the model linearized again using the changed information. The linearization tool 210 and the analysis tool 220 will be described below in more detail with reference to FIG. 3.

Figure 3:
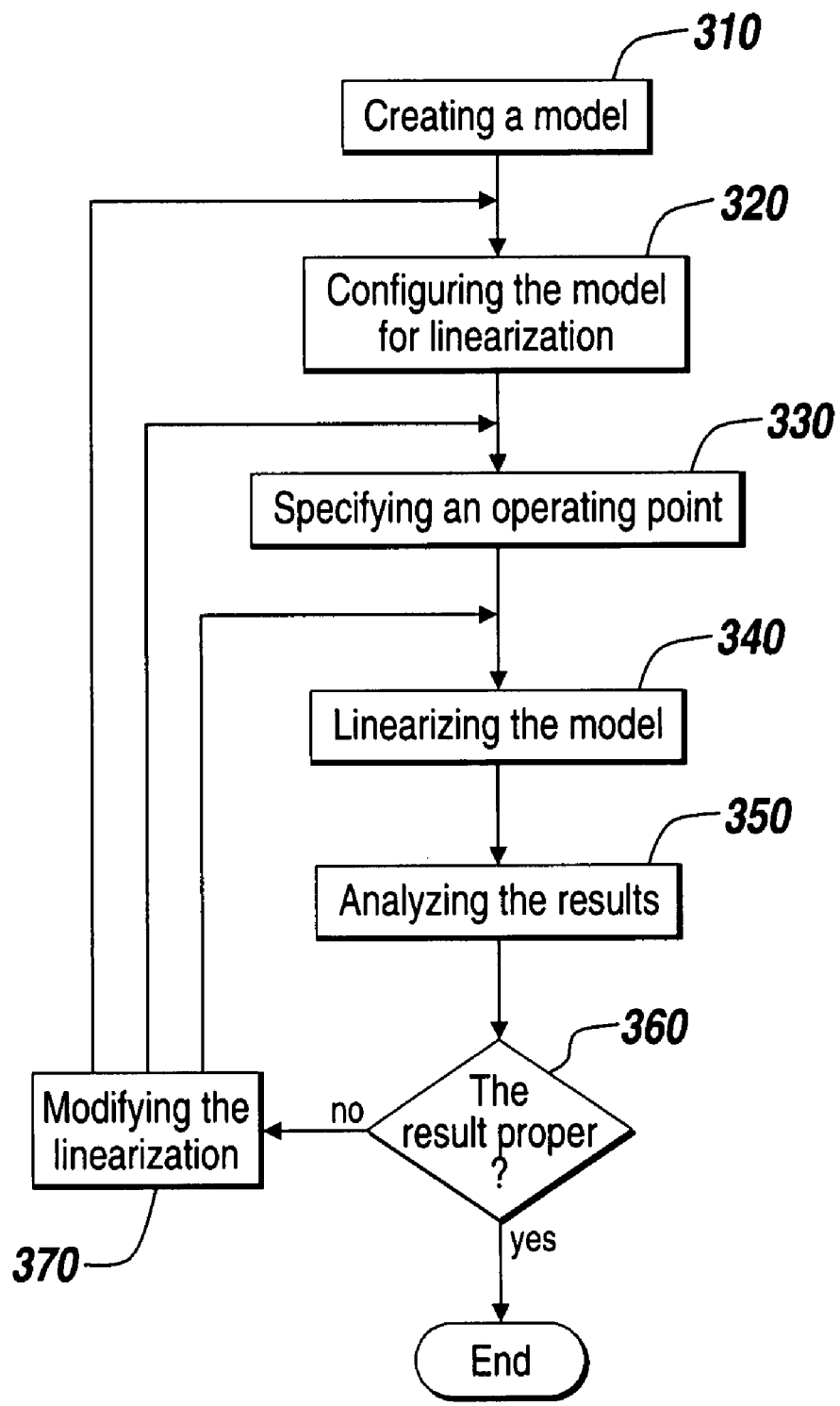
FIG. 3 is a flow chart showing an exemplary operation of the block diagram modeling environment.

FIG. 3 is a flow chart showing an exemplary operation for linearizing a model and analyzing the linearization of the model in the block diagram modeling environment 200. First, users may create a model using an editing tool in the modeling environment 200 (step 310). The editing tool may provide graphical user interfaces (GUIs) that enable the users to build the model in the block modeling environment 200. Methods are called by the block diagram modeling environment in order to render the block appropriately in the GUI of its parent block diagram. For instance, this set of methods may include a BlockDrawIcon method that determines the shape the block icon has on the GUI. The block diagram modeling environment may allow users to specify the parameters for the block when they use it in the model. The users generally interact with a set of windows that act as canvases for the model. There is generally more than one window for a model because models may be partitioned into multiple hierarchical levels through the use of subsystems. The building of the block diagram model will be described below in more detail with reference to FIG. 4.

Figure 4:
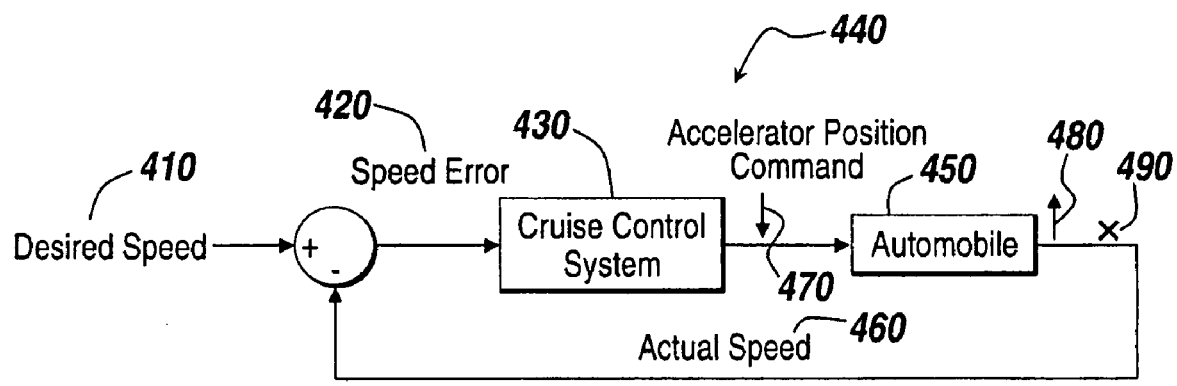
FIG. 4 shows an exemplary block diagram model generated in the block diagram modeling environment.

FIG. 4 is an exemplary block diagram model 400 generated in the block diagram modeling environment 200. The model 400 shows that the Desired Speed 410 and the Actual Speed 460 are compared to arrive at the Speed Error 420. The Speed Error 420 is then an input to the Cruise Control System 430, which has the ability to adjust the speed. The Cruise Control System 430 is in communication with the Accelerator Position Command 440 to set the position of the accelerator pedal, thus adjusting the speed of the automobile 450. The automobile 450 then provides output feedback, through the speedometer, in the form of the Actual Speed 460 for comparison, again, with the Desired Speed 410. The goal of the system is to control the speed of a car driving down the road at a user defined Desired Speed 410. An Actual Speed 460 signal is called the feedback signal, and is used to compute a Speed Error 420, which is the difference between the Desired Speed 410 and the Actual Speed 460. The Cruise Control System 430 is designed to respond to the Speed Error 420 and compute an Accelerator Position Command 440 to change the speed of the Automobile 450.

The design of the Cruise Control System 430 requires that the behavior of the Automobile 450 is known. For the Cruise Control System 430, it must be understood how the position of the accelerator pedal affects the speed of the Automobile 450 over time. Having an accurate understanding of the behavior of the Automobile 450 allows for a high performance Cruise Control System 430 to be designed. This behavior is typically captured in a physical model. In many cases, accurate models of physical systems require very complex descriptions. Unfortunately, the design tools for control systems can only be applied to simpler models. A standard approach for control system design is to develop a physical model using complicated descriptions and implement it in a block diagram programming tool. The model is then analyzed using approximation techniques to reduce the model to a simple form for analysis. The approach most widely used approximation technique is the process of linearization.

Before linearizing the model 400, the model 400 is configured for linearization (step 320). The configuration may include the selection of input and output linearization points. For example, the input and output linearization points may be indicated with graphical icons 470 and 480 within the model 400. The linearization input point 470 defines an input to the linear model while a linearization output point 480 defines an output of the linear model. The region between the input and output linearization points 470 and 480 defines the portion of the model 400 that is to be linearized. Users can linearize the whole model 400 or any blocks or subsystems within the model 400.

Due to the presence of a feedback loop in the model 400, the input and output linearization points 470 and 480 may not completely define the portion of the model that is to be linearized. In this case, to remove the effect of signals feeding back into the portion of the model 400 that is to be linearized, users may choose to insert an open loop point 490, which represents the feedback loop opening. The selection of the feedback loop opening leads to the linearization of the Automobile 450 only without the effect of the feedback loop.

After configuring the model 400 for linearization, one or more operating points are specified about which to linearize the model 400 (step 330). The operating points of the model 400 define its total "state" at any given time. For example, for the model of a car engine, the operating points are typically described by variables such as engine speed, throttle angle, engine temperature, and the surrounding atmospheric condition. The behavior or what is typically known as the "dynamics" of the model are generally affected by the values of the operating points. For example in a car, the behavior of an engine can greatly vary if the car is being operated in the high elevations or the low elevations. In this case the elevation is part of an operating point for the car engine. A linear model is an approximation that is valid in a small region around the operation point of the system. Near the operating point the approximation will be good, while far away it will be poor. A linear model of a car being operated at 3000 ft. will be very accurate at elevations close to 3000 ft. but less accurate as the car travels higher or lower.

Figure 5:
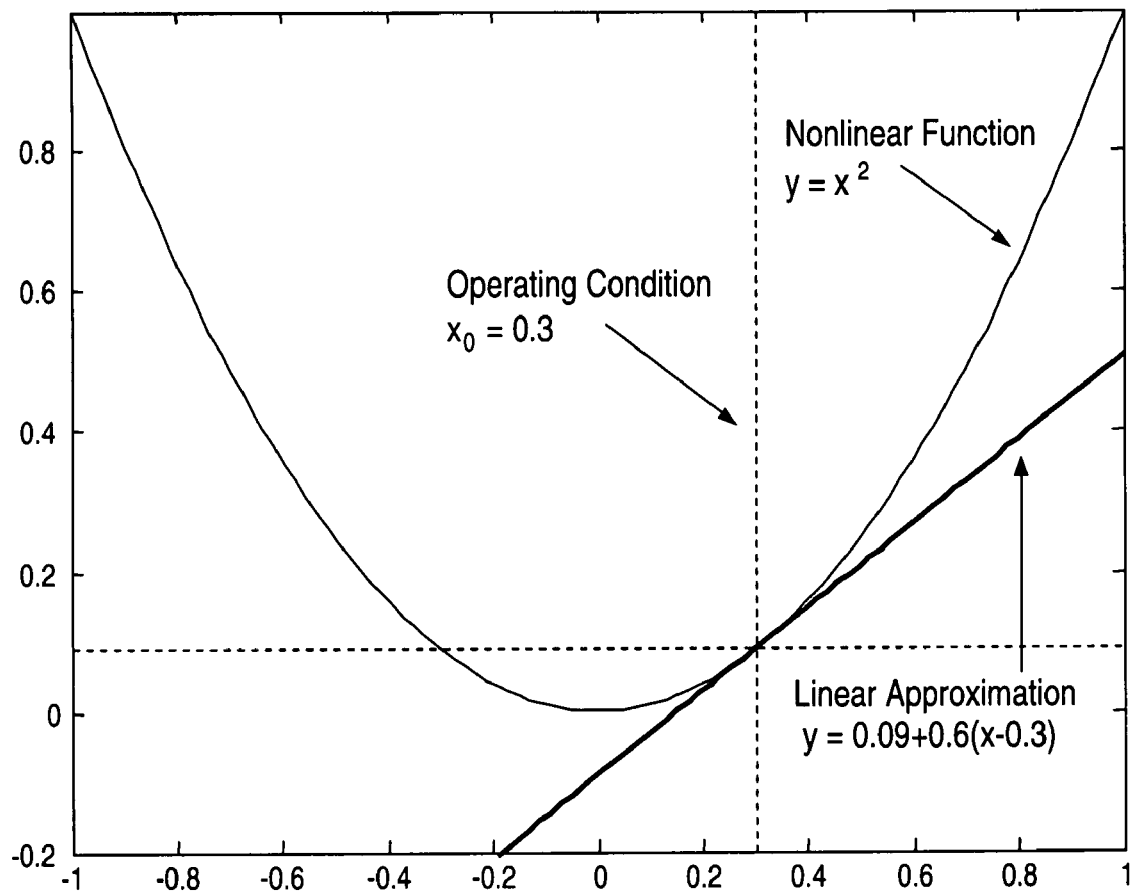
FIG. 5 depicts an exemplary nonlinear function and a linear approximation of the nonlinear function at an operating point.

FIG. 5 illustrates an operating point with an exemplary non-linear function, $y=x^2$. If the linear approximation is picked to be at $x=0.3$, the original function has an approximation, $y \approx 0.09+0.6(x-0.3)$. This approximation is the equation of a straight line. The original function is intersected by the linear approximation at $x=0.3$. In the region about $x=0.3$, the approximation is very accurate, but once x moves far away from $x=0.3$, the approximation becomes very poor. In general, for the linearization of a complex physical system, the approximation is accurate near the selected operating point.

Therefore the specification of the operating point directly determines the answer given by linearization.

In Simulink® and Simulink Control Design the linearization tool 210 performs the linearization of a model based on an operating point that a user specifies. They can either specify an operating point by:

Specifying the operating point exactly. In this case the user the operating points of a model are presented with a data object or graphical user interface.

Performing an operating point search using target values or constraints on a subset of the model's inputs, outputs, and states. Numerical methods are used to determine the full operating point based on this partial specification.

Generating a set of operating points through Simulink® using time-based and trigger-based linearization. The time-based linearization creates a linear model when the simulation clock reaches the time specified by the linearization time parameter. The trigger-based linearization generates a linear model when triggered. When triggered, the tool 210 generates a linear model at the current operating point. The linear model is stored in the base workspace or in a graphical user interface as a data structure, along with information about the operating point at which the linearization is performed.

With the information specified above, such as the linearization input and output points and the operating points, the model 400 is linearized to generate a linear model using the linearization tool 210 (step 340 in FIG. 3). The process of linearization is the approximation of complex models (i.e., non-linear models) that yields a sufficiently simple linear model for engineering analysis tools. A fundamental principle of linearization analysis is that the approximation of a complex model is accurate for regions near a baseline, equilibrium, or operating condition.

A large class of physical systems is typically modeled using sets of nonlinear differential equations of motion. The differential equations are written in the form:

$$\dot{x}(t) = f(x(t), u(t))$$

$$y(t) = g(x(t), u(t))$$

Where:

t=time x(t)—A vector of model states of length n $\dot{x}(t)$—A vector of the state derivatives of length n u(t)—A vector of model inputs of length p y(t)—A vector of model outputs of length q f(x(t),u(t))—A nonlinear function which maps x(t) and u(t) to the state derivatives $\dot{x}(t)$.

g(x(t),u(t))—A nonlinear function which maps x(t) and u(t) to the model outputs y(t).

In the block diagram modeling environment, the nonlinear functions f(x(t),u(t)) and g(x(t),u(t)) are a result of the construction of a model. The choice of the blocks, block interconnectivity, and the operating conditions of the model, define these functions.

Linearization is a process of approximating a set of nonlinear differential equations about an operating condition where the states are at a nominal value $x(t)=x_0$ and the model inputs are at a nominal value $u(t)=u_0$. Linearization uses a first order Taylor series approximation to give $$\dot{x}(t) \approx f(x_0, u_0) + \frac{\partial f}{\partial x}\bigg|_{\substack{x=x_0 \\ u=u_0}} (x(t) - x_0) + \frac{\partial f}{\partial u}\bigg|_{\substack{x=x_0 \\ u=u_0}} (u(t) - u_0)$$

$$y(t) \approx g(x_0, u_0) + \frac{\partial g}{\partial x}\bigg|_{\substack{x=x_0 \\ u=u_0}} (x(t) - x_0) + \frac{\partial g}{\partial u}\bigg|_{\substack{x=x_0 \\ u=u_0}} (u(t) - u_0).$$

Defining variables about the operating point:

$$\Delta x(t) = x(t) - x_0$$

$$\Delta u(t) = u(t) - u_0$$

$$\Delta y(t) = y(t) - g(x_0, u_0)$$

gives $$\Delta \dot{x}(t) \approx \frac{\partial f}{\partial x}\bigg|_{\substack{x=x_0 \\ u=u_0}} \Delta x(t) + \frac{\partial f}{\partial u}\bigg|_{\substack{x=x_0 \\ u=u_0}} \Delta u(t)$$

$$\Delta y(t) \approx \frac{\partial g}{\partial x}\bigg|_{\substack{x=x_0 \\ u=u_0}} \Delta x(t) + \frac{\partial g}{\partial u}\bigg|_{\substack{x=x_0 \\ u=u_0}} \Delta u(t)$$

or more commonly described as $$\Delta \dot{x}(t) \approx A \Delta x(t) + B \Delta u(t)$$

$$\Delta y(t) \approx C \Delta x(t) + D \Delta u(t)$$

where the matrices $$A = \frac{\partial f}{\partial x}\bigg|_{\substack{x=x_0 \\ u=u_0}} \quad B = \frac{\partial f}{\partial u}\bigg|_{\substack{x=x_0 \\ u=u_0}}$$

$$C = \frac{\partial g}{\partial x}\bigg|_{\substack{x=x_0 \\ u=u_0}} \quad D = \frac{\partial g}{\partial u}\bigg|_{\substack{x=x_0 \\ u=u_0}}$$

are known as the Jacobian matrices. It is the task of the linearization tool 210 to find the state space matrices A, B, C, and D.

In many block diagram modeling environments, models can be described by continuous differential equations, discrete equations of motion, and hybrids of continuous and discrete equations. These systems can additionally be referred to as multi-rate systems. This more general description of a multi-rate system is described by $$\dot{x}(t) = f(x(t), x_1(k_1), \ldots, x_m(k_m), u(t))$$

$$x_1(k_1+1) = f_1(x(t), x_1(k_1), \ldots, x_m(k_m), u(t))$$

$$\ldots$$

$$x_m(k_m+1) = f_m(x(t), x_1(k_1), \ldots, x_m(k_m), u(t))$$

$$y(t) = g(x(t), x_1(k_1), \ldots, x_m(k_m), u(t))$$

where t=time x(t)—A vector of model continuous model states of length n $\dot{x}(t)$—A vector of the state derivatives of length n $x_i(k_i)$—A vector of model discrete model states of length $n_i$ at a sample time $k_i$ u(t)—A vector of model inputs of length p y(t)—A vector of model outputs of length q $f(x(t),x_1(k_1), \ldots, x_m(k_m),u(t))$—A nonlinear function which maps x(t), $x_1(k_1), \ldots, x_m(k_m)$ and u(t) to the state derivatives $\dot{x}(t)$ $f_i(x(t),x_1(k_1), \ldots, x_m(k_m),u(t))$—A nonlinear function which maps x(t), $x_1(k_1), \ldots, x_m(k_m)$ and u(t) to the update of the discrete state $x_i(k_i)$ $g(x(t),x_1(k_1), \ldots, x_m(k_m),u(t))$—A nonlinear function which maps which maps x(t), $x_1(k_1), \ldots, x_m(k_m)$ and u(t) to the model output y(t)

The approach for this type of problem is to approximate this multi-rate system by a single rate discrete system:

$$\Delta x(k+1) \approx A\Delta x(k) + B\Delta u(k)$$

$$\Delta y(k) \approx C\Delta x(k) + D\Delta u(k)$$

Figure 6:
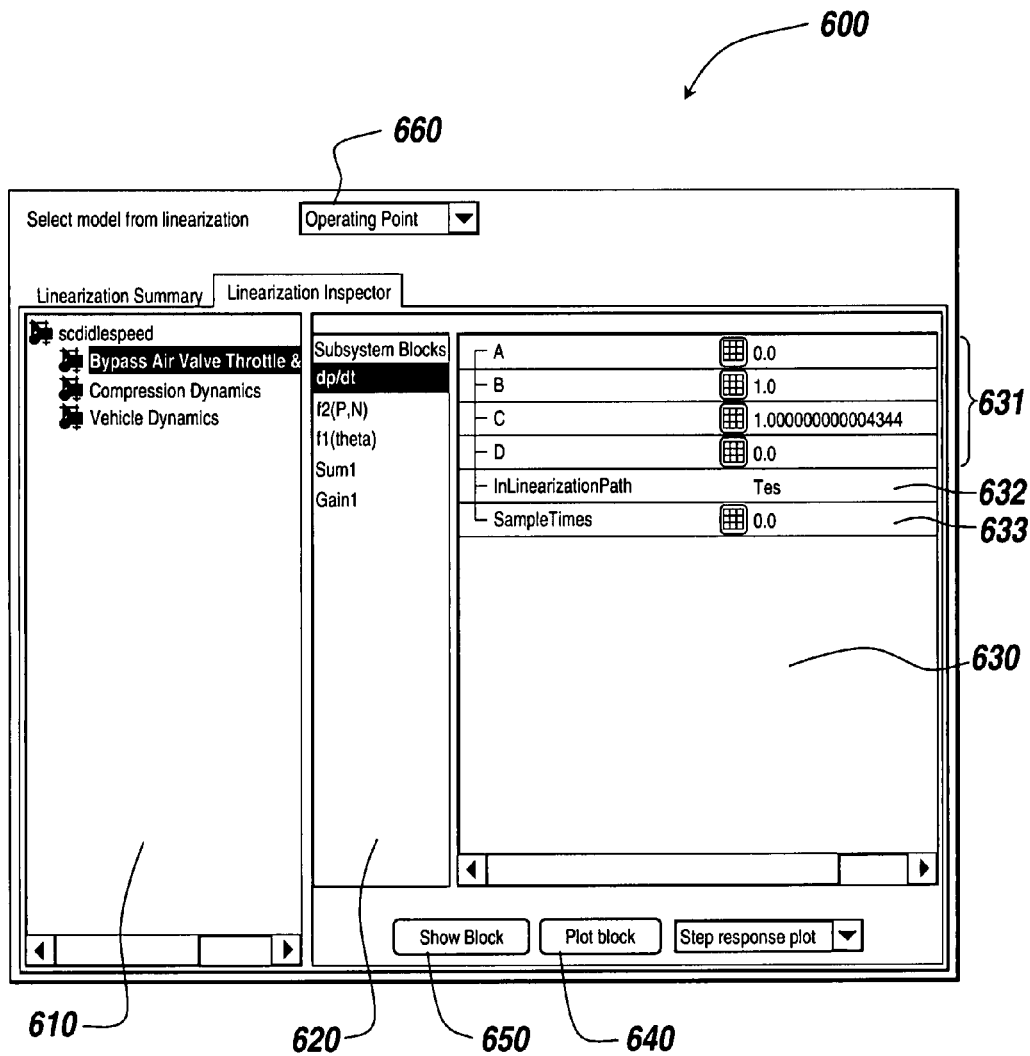
FIG. 6 shows an exemplary user interface for providing information on the linearization of the model.

After linearizing the model 400, the analysis tool 220 analyzes the linearization results of the model 400 and provides users with information on the linearization results of the model 400 (step 350). FIG. 6 shows an exemplary user interface 600 for providing information on the linearization of the model. In the user interface 600, the block diagram model 400 may be displayed in a hierarchical fashion. For example, the user interface 600 may include a pane 610 for displaying subsystems of the model 400 and an additional pane 620 for displaying blocks in each of the subsystems displayed in the pane 610. This allows the users to browse through the model's hierarchy to find a specific block. The user interface 600 includes a pane 630 for displaying information on the linearization of a block selected in the pane 620. The information displayed in the pane 630 includes the values of state space matrices A, B, C and D 631 that represent the linearization of the selected block. The user may also display the linearization of each specific block in the transfer function or zero-pole-gain format. The information displayed in the pane 630 also includes the sample times 633 used in the linearization of the selected block. The information displayed in the pane 630 further includes information on whether the selected block's linearization effects the linearization of the model 400. In the illustrative embodiment, blocks are determined to contribute to the linearization of the model if the blocks are on the path between the input and output linearization points. If blocks are outside the path between the input and output linearization points, the blocks are determined not to contribute to the linearization of the model.

The user interface 600 may provide users with an option 640 that allows users to plot the response of the selected block or subsystem using the linearization of the model. The response may be plotted in any of the standard plots for linear time invariant systems, such as a step response plot, an impulse response plot, an initial condition plot, a Bode plot, a Nyquist plot, a Nichols plot, a Zero-Pole plot, and arbitrary simulations. The user interface 600 may also provide users with an option 650 that highlights the selected block in the model 400. The user interface 600 may further provide users with an option 660 for selecting an operating point. If the users have computed the linearization at multiple operating points, the users are able to select and inspect the linearization associated with one of the operating points.

Figure 7A:
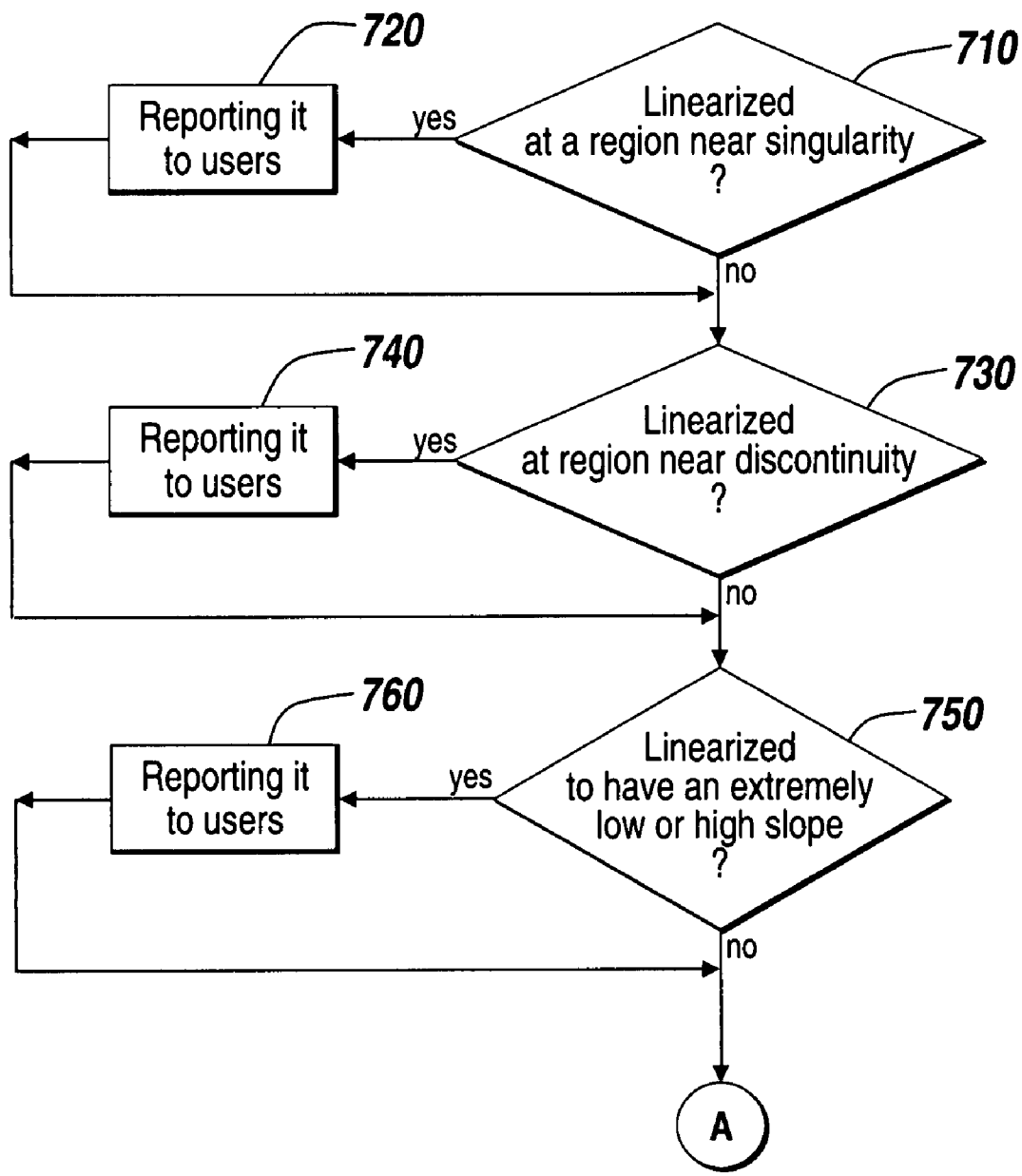
FIGS. 7A and 7B are a flow chart showing an exemplary operation of the analysis tool depicted in FIG. 2.
Figure 7B:
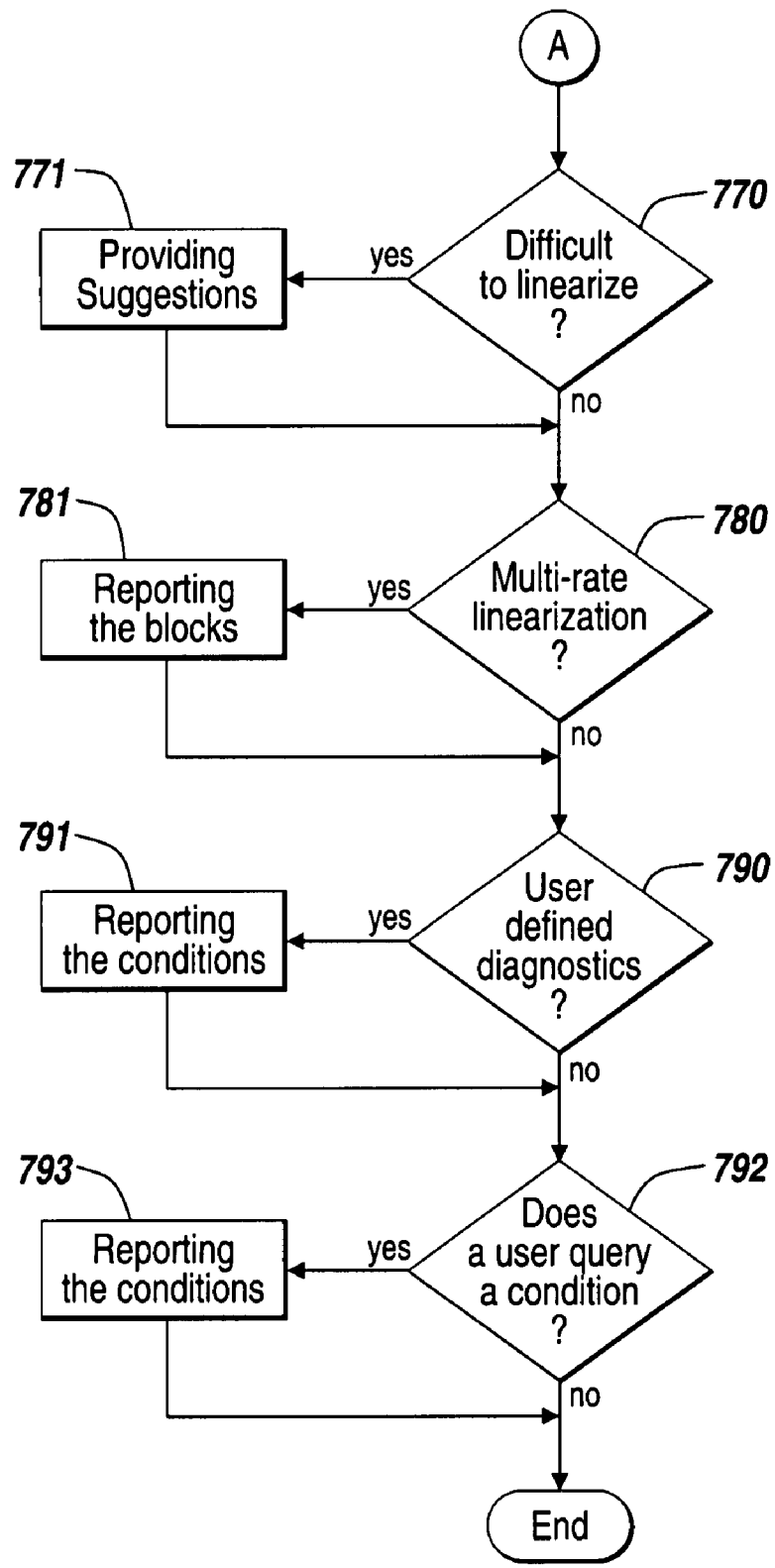

The analysis tool 220 may further analyze the linear model to determine whether the model 400 is linearized in improper conditions. FIGS. 7A and 7B are a flow chart showing an exemplary operation of the analysis tool 220 in the illustrative embodiment. For example, the linear model is analyzed to determine whether the model 400 is linearized at a region near singularity (step 710). In general, a singularity is a point at which an equation, surface, etc., blows up or becomes degenerate. Singularities are often also called singular points. For example, a block representing the function y=1/u has a singularity at u=0. If this function block is linearized at a region near x=0, the analysis tool 220 displays on the user interface 600 some information indicating that the function block is linearized near a singularity (step 720).

Figure 8A:
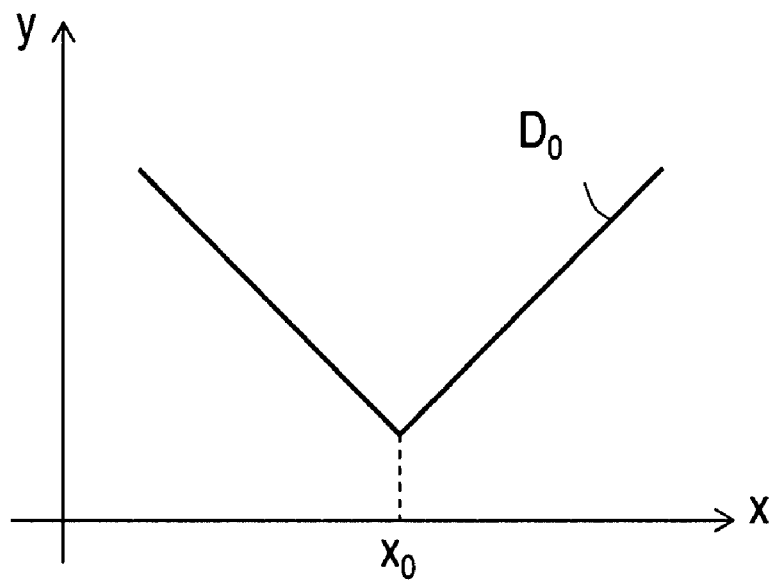
FIGS. 8A and 8B depict an exemplary function that has a discontinuity in the linearization of the function.
Figure 8B:
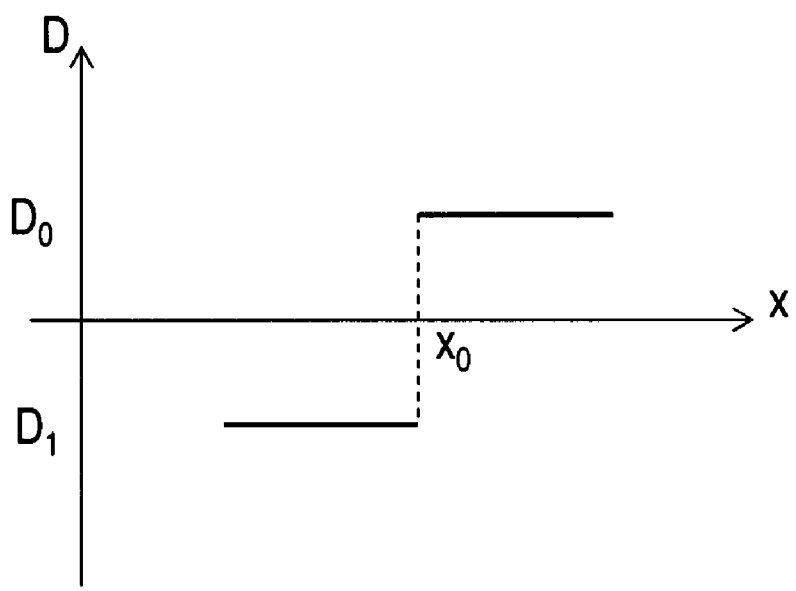

The linear model is also analyzed to determine whether the model 400 is linearized at a region near discontinuity (step 730). The discontinuity is a point at which a mathematical object is discontinuous. In particular, the discontinuity may include discontinuity points in the linearized mathematical object, as depicted in FIG. 8B. FIG. 8B depicts the linearization of the mathematical function depicted in FIG. 8A. If the function is linearized at a region less than x0, the function is linearized to have a slope of D0, and if the function is linearized at a region greater than x0, the function is linearized to have a slope of D1. D0 and D1 are discontinuous at x0. The discontinuity may be determined using numerical perturbation in which the small perturbation to the input signal is introduced and the corresponding perturbation to the output signal is measured. If the slopes measured in perturbation include a large difference of values, the point is determined as the discontinuity. If the function is linearized at a region near x0, the analysis tool 220 displays on the user interface 600 some information indicating that the selected block is linearized near a discontinuity (step 740).

The linear model is further analyzed to determine whether the model 400 is linearized to have an extremely low or high slope, for example, about zero or infinite slope (step 750). The extremely low or high slope may indicate that the model 400 is linearized improperly. If the linear model has an extremely low or high slope, the analysis tool 220 displays on the user interface 600 some diagnostic information indicating that the selected block is linearized improperly (step 760).

In addition to the above examples of problematic linearization other situations that can be reported include:

Blocks that are known to be difficult to linearize (step 770). This can be due to the numerical limits of linearization or due to the nature of some of the blocks in the model. The linearization tools will provide suggestions for suitable replacements or modeling changes for linearizations (step 771).

Blocks in a model which extra care must be provided (step 781) when considering a multi-rate linearization (step 780). For example the discretization of transport delays is known to be particularly difficult. The tool would then give users suggestions on the best way to handle the discretization of these blocks.

User defined diagnostics (step 790) to check for specific conditions of a linearization of a specific block or subsystem type (step 791).

In addition to diagnostic information, the user may query (step 792) for specific condition of a linearization of a specific block type or subsystem type (step 793). The conditions include searching (or querying) for:

Specific block linearizations. An example of this would be searching for blocks that have elements in their D-matrix which are greater then a quantity.

Specific block operating conditions. For example a user may search for all saturation blocks that have an input that is in the region of saturation.

Referring back to FIG. 3, users may inspect all the information provided on the user interface 600 on the linearization of the selected model. Based on the information provided on the user interface 600, the users determine whether the linearization is performed properly (step 360). If the users determine that the linearization of the model 400 is not proper, the users may modify the linearization results of the selected block (step 370) and have the linearization tool 210 recompute the linearization of the model 400 using the modified information. In addition to modifying the linearization, the user interface may report to the user suitable modifications that can be made to the model or operating point to improve the results of a linearization.

Users may change the individual linearization results including the state space matrices A, B, C, and D 631 of a selected block, or the users may enter a new transfer function for the selected block. The users can also choose to change the sample rate 633 of the selected block using discretization methods such as zero order hold discretization. The users can also change the representation of time delay blocks if the model 400 includes time delay blocks. The representation of the time delay blocks can vary from an exact continuous representation, a Padé approximation, or an approximate discrete representation. The users may select one of other representations of the time delay blocks if the users determine that the linearization of the current representation of the time delay blocks is not accurate.

As described above, the linearization tool 210 allows the linearization of a subsystem inside the block diagram model 400. The users are also able to replace the components of the subsystem with the linear subsystem in the model. This allows the users to reduce the complexity (fidelity) of the model with a linear component.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure and method may vary substantially without departing from the spirit of the invention, and exclusive use of all modifications that come within the scope of the appended claims is reserved. It is intended that the present invention be limited only to the extent required by the appended claims and the applicable rules of law.

What is claimed is:

1. A computer-readable medium containing instructions executable by at least one processor, the computer-readable medium comprising:
   one or more instructions for providing an interface for defining a block diagram model representing a system and selecting an input linearization point, an output linearization point, and an operating point, the block diagram model comprising a plurality of blocks;
   one or more instructions for linearizing the block diagram model based on the input linearization point, the output linearization point, and the operating point to form a linearized model;
   one or more instructions for analyzing a linearization result of a portion of the block diagram model to determine block level contribution information of the portion toward an overall linearization result of the block diagram model, the portion comprising at least one block but less than the plurality of blocks in the block diagram model; and
   one or more instructions for outputting information concerning a result of analyzing the linearization result, said information including the block level contribution information.

2. The computer-readable medium of claim 1, wherein the one or more instructions for analyzing include:
   one or more instructions for modifying at least one parameter associated with the at least one block; and
   one or more instructions for re-linearizing the at least one block using the at least one modified parameter.

3. The computer-readable medium of claim 1, wherein the contribution information includes whether the at least one block is linearized in at least one of a discontinuity region, a singularity region, about a zero slope, or about an infinite slope.

4. The computer-readable medium of claim 1, wherein the one or more instructions for analyzing include one or more instructions for plotting the linearization result of the at least one block.

5. The computer-readable medium of claim 4, wherein the one or more instructions for plotting include one or more instructions for plotting the linearization result in at least one of a Step Response plot, an Impulse Response plot, a Bode plot, a Nyquist plot, a Nichols plot, or a Pole-Zero Response plot.

6. The computer-readable medium of claim 1, wherein the contribution information includes whether the at least one block exceeds a numerical or a computational threshold of linearization, and
   one or more instructions for analyzing include one or more instructions for providing to the user at least one substitute block when the at least one block exceeds a numerical or a computational threshold of linearization.

7. The computer-readable medium of claim 1, wherein the one or more instructions for analyzing include one or more instructions for defining a diagnostic to check for a condition associated with the linearization of the at least one block.

8. The computer-readable medium of claim 1, wherein the one or more instructions for analyzing include one or more instructions for querying for a condition associated with the linearization of the at least one block.

9. The computer-readable medium of claim 1, wherein the one or more instructions for providing the interface include one or more instructions for defining at least one of a time-based block diagram, a state-based and flow diagram, or a data flow diagram.

10. The computer-readable medium of claim 1, wherein the one or more instructions for linearizing include one or more instructions for linearizing the block diagram model based on a time-based trigger or a non-time-based trigger.

11. The computer-readable medium of claim 1, wherein the one or more instructions for analyzing include one or more instructions for modifying at least one of a transfer function, a sample rate, or a time delay block associated with the at least one block.

12. The computer-readable medium of claim 11, wherein the one or more instructions for modifying the time delay block include one or more instructions for selecting from at least one of an exact continuous representation, a Padé approximation, or an approximate discrete representation.

13. A computing device-implemented method, comprising:
- providing an interface for defining a block diagram model that represents a system, the block diagram model comprising a plurality of blocks;
- linearizing at least a portion of the block diagram model;
- analyzing a linearization result of a portion of the block diagram model to determine block level contribution information of the portion toward an overall linearization result of the block diagram model, the portion comprising at least one block but less than the plurality of blocks in the block diagram model; and
- outputting information concerning a result of analyzing the linearization result, said information including the block level contribution information.

14. The computing device-implemented method of claim 13, wherein the analyzing comprises:
- modifying at least one parameter associated with the at least one block of the linearized model; and
- re-linearizing at least the at least one block based on the at least one modified parameter.

15. The computing device-implemented method of claim 13, wherein the contribution information includes whether the at least one block is linearized in at least one of a discontinuity region, a singularity region, about a zero slope, or about an infinite slope.

16. The computing device implemented method of claim 13, wherein the analyzing comprises:
- plotting the linearization result of the at least one block.

17. The computing device-implemented method of claim 13, further comprising:
- displaying values of state space matrices, sample times, and whether the at least one block is in a linearization path.

18. The computing device-implemented method of claim 13, wherein the contribution information includes whether the at least one block exceeds a numerical limit of linearization, and
- wherein the analyzing comprises selecting at least one replacement block when the at least one block exceeds a numerical limit of linearization.

19. The computing device-implemented method of claim 13, wherein the analyzing comprises:
- defining a diagnostic to check for a condition associated with the at least one block.

20. The computing device-implemented method of claim 13, wherein the analyzing comprises:
- searching for a linearization condition associated with the at least one block.

21. The computing device-implemented method of claim 13, wherein the linearizing comprises:
- linearizing at least the portion of the block diagram model based on a time-based trigger or a non-time based trigger.

22. The computing device-implemented method of claim 13, wherein the analyzing comprises:
- modifying at least one of state space matrices, a transfer function, sample times, or a time delay block; and
- re-linearizing a portion of the block diagram model that includes the modified state space matrices, transfer function, sample times, or time delay block.

23. The computing device-implemented method of claim 22, wherein the time delay block includes at least one of an exact continuous representation, a Padé approximation, or an approximate discrete representation.

24. A device, comprising:
- a memory to store instructions; and
- a processor to execute the instructions to:
  - define a block diagram model that represents a system, the block diagram model comprising a plurality of blocks,
  - execute at least a portion of the block diagram model,
  - analyze execution results of a portion of the block diagram model to determine block level contribution information toward an overall linearization result of the block diagram model, the portion comprising at least one block but less than the plurality of blocks in the block diagram model, wherein the contribution information includes at least one of an input signal, an output signal, a state signal, or a linearization parameter associated with the at least one block; and
  - output information regarding a result of the analyzing, said information including the block level contribution information.

25. A computer system, comprising:
- an input device for enabling a user to enter input; and
- a processor configured to:
  - define a block diagram model that represents a system, the block diagram model comprising a plurality of blocks;
  - linearize at least a portion of the block diagram model based on the input; and
  - analyze a parameter affecting a linearization result of a portion of the block diagram model to determine individual contribution information of the parameter of the portion toward an overall linearization result of the block diagram model, the portion comprising at least one block but less than the plurality of blocks in the block diagram model; and
  - output the individual contribution information of the parameter of the portion toward the overall linearization result of the block diagram model.

* * * * *